United States Patent [19]
Le et al.

[11] Patent Number: 6,125,073
[45] Date of Patent: Sep. 26, 2000

[54] INTEGRATED SEMICONDUCTOR MEMORY

[75] Inventors: Thoai-Thai Le, Münich; Jürgen Lindolf, Friedberg; Eckhard Brass, Unterhaching; Martin Brox, Münich, all of Germany

[73] Assignee: Siemens Aktiengesellschaft, Munich, Germany

[21] Appl. No.: 09/391,717

[22] Filed: Sep. 8, 1999

[30] Foreign Application Priority Data

Sep. 8, 1998 [DE] Germany ............... 198 40 983

[51] Int. Cl.$^7$ ...................................... G11C 8/00
[52] U.S. Cl. ........................... 365/230.03; 365/227
[58] Field of Search ............... 365/230.03, 230.06, 365/227, 189.09, 185.11, 185.18

[56] References Cited

U.S. PATENT DOCUMENTS

| | | | |
|---|---|---|---|
| 5,109,265 | 4/1992 | Utesch et al. ............................. | 357/45 |
| 5,699,303 | 12/1997 | Hamamoto et al. ............... | 365/189.09 |
| 5,818,764 | 10/1998 | Yiu et al. ............................. | 365/185.11 |
| 5,841,705 | 11/1998 | Hamamoto et al. ............... | 365/189.09 |
| 6,031,780 | 2/2000 | Abe ........................................ | 365/227 |
| 6,031,781 | 2/2000 | Tsuji et al. ............................. | 365/227 |
| 6,044,033 | 3/2000 | Jang ................................... | 365/230.03 |

FOREIGN PATENT DOCUMENTS

| | | |
|---|---|---|
| 19639701A1 | 4/1998 | Germany . |
| 19613667A1 | 11/1998 | Germany . |

*Primary Examiner*—Andrew Q. Tran
*Assistant Examiner*—Anh Phung
*Attorney, Agent, or Firm*—Herbert L. Lerner; Laurence A. Greenberg; Werner H. Stemer

[57] ABSTRACT

In an integrated semiconductor memory having a memory cell array divided into memory banks, supply potentials with high drive capability are applied to the memory banks only if the respective memory bank is activated for access to a memory cell. For this purpose a supply voltage assigned to the respective memory bank is controlled by the same address signal as the memory bank. The supply voltage sources generate a word line potential, a bit line potential or a substrate potential. As a result, a power loss is reduced.

9 Claims, 3 Drawing Sheets

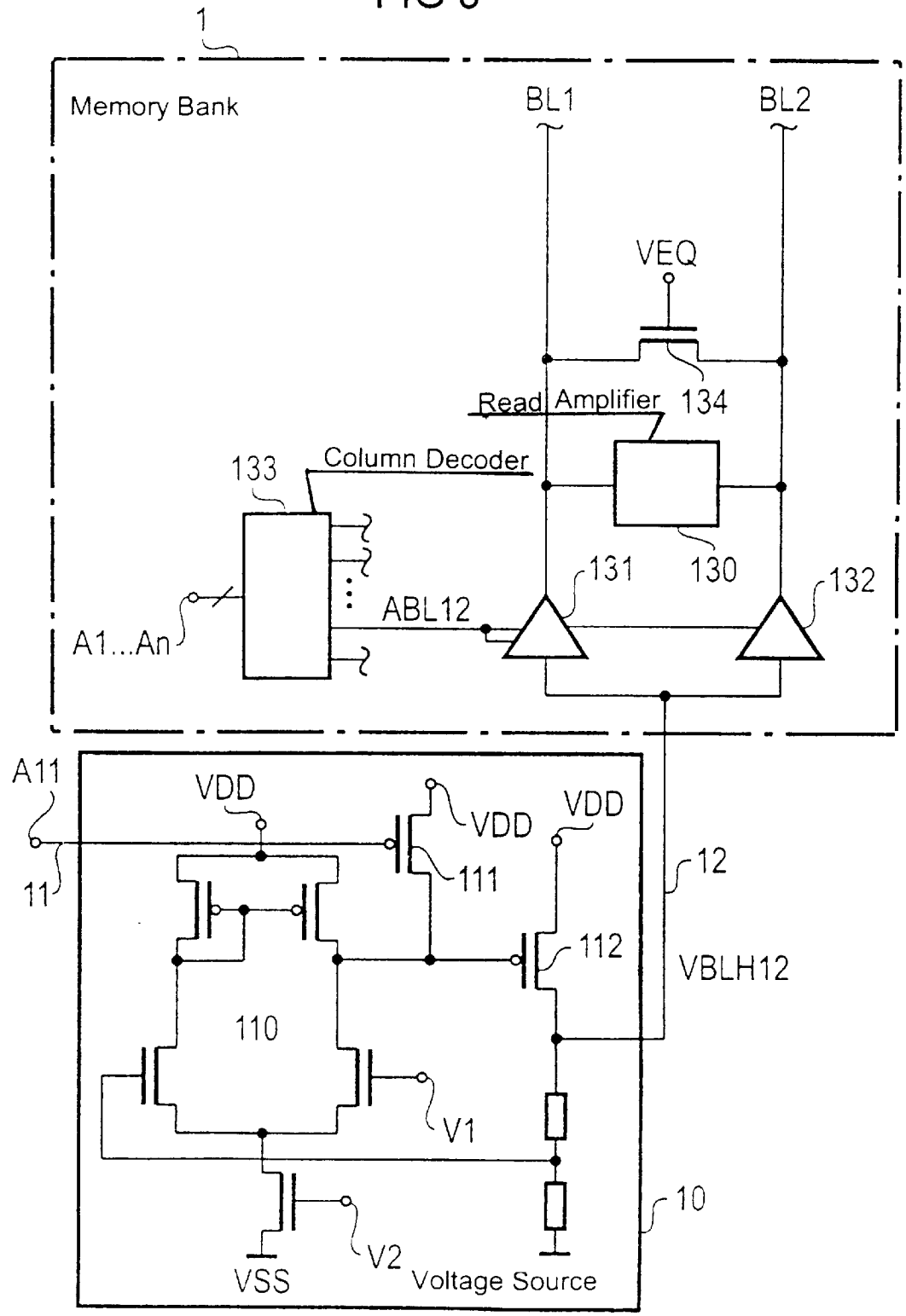

INTEGRATED SEMICONDUCTOR MEMORY

BACKGROUND OF THE INVENTION

Field of the Invention

The invention concerns an integrated semiconductor memory with a plurality of memory cells which are disposed in at least two memory banks.

Integrated semiconductor memories contain a plurality of memory cells. As shown in U.S. Pat. No. 5,109,265 the memory cells are divided into four memory banks.

From the applied supply voltage, different further voltages or potentials are generated on the integrated semiconductor memory and applied to the memory cell array. For example, a substrate bias is applied to the substrate; a word line voltage is applied to the word lines of the memory banks; and bit lines are supplied with a bit line voltage. A substrate potential is lower than the external supply voltage applied to the semiconductor chip, the word line voltage is above the externally applied supply voltage, and the bit line potential lies within the externally applied supply voltage. The power loss of the respective voltage generators is not insignificant, especially in the case of the substrate bias and the word line voltage.

Increasing storage capacity is also accompanied by increases in the capacitative loads to be driven by the respective voltage sources, e.g. the capacitance of word lines, bit lines or substrate. This demands high drive capability of the corresponding voltage generators. Thus with increasing storage capacity the power loss of the voltage sources also increases and can no longer be ignored compared with other sources of power loss. This effect becomes noticeable from a storage capacity of approximately 1 Gbit.

In Published, Non-Prosecuted German Patent Application DE 195 13 667 A1 a semiconductor memory is described for which the voltage generator for the word line voltage is driven with higher drive capability during a refresh or CBR mode and with lower drive capability at other times. All the memory cells under consideration are addressed by the same address decoder.

SUMMARY OF THE INVENTION

It is accordingly an object of the invention to provide an integrated semiconductor memory that overcomes the above-mentioned disadvantages of the prior art devices of this general type, in which the power loss is minimal.

With the foregoing and other objects in view there is provided, in accordance with the invention, an integrated semiconductor memory, including: a plurality of memory banks containing a first memory bank and a second memory bank each having memory cells and an address decoder for addressing the memory cells, through the address decoder only the memory cells of a respective memory bank of the plurality of memory banks being addressable; controllable supply voltage sources, each of the controllable supply voltage sources associated with and supplying one of the plurality of memory banks with a respective supply potential; and a decoder generating output signals, a respective output signal of the output signals received by each of the plurality of memory banks, the respective output signal from the decoder activating and deactivating a memory access to the respective memory bank by controlling the respective supply potential provided by an associated one of the controllable supply voltage sources, the respective memory bank being provided with a higher drive capability if the respective memory bank being activated through the respective output signal and provided with a lower drive capability if the respective memory bank being deactivated through the respective output signal.

According to the invention a supply voltage source is assigned to every memory bank of the integrated semiconductor memory chip. The supply voltage source generates a word line potential, a bit line potential or a substrate potential, either alternatively or combined. When the memory bank is activated by a memory access, for which purpose a correspondingly decoded address signal is suitable, the drive capability is raised of the assigned supply voltage source. If another memory bank is activated and the first memory bank is deactivated the drive capability of the supply voltage source is lowered again. Power loss is saved accordingly. When the assigned memory bank is activated the supply voltage source is driven under full load. When the memory bank is deactivated the supply voltage source is operated with a drive capability lower than full load such that only leakage current losses in the memory cell array are compensated; or it is disconnected completely.

The supply voltage sources for the word line and the substrate potentials are so-called voltage boosters whose generated output voltage or the output potential generated relative to reference potential lies outside the supply voltage applied to the input side. Such voltage sources are driven in a clocked manner and contain an oscillator. Switching over from full load to part load simply involves reducing a clock frequency of the voltage source.

Other features which are considered as characteristic for the invention are set forth in the appended claims.

Although the invention is illustrated and described herein as embodied in an integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a circuit diagram of a detail part of an embodiment for generation of a bit line voltage.

DESCRIPTION OF THE PREFERRED EMBODIMENTS

Figure 1:
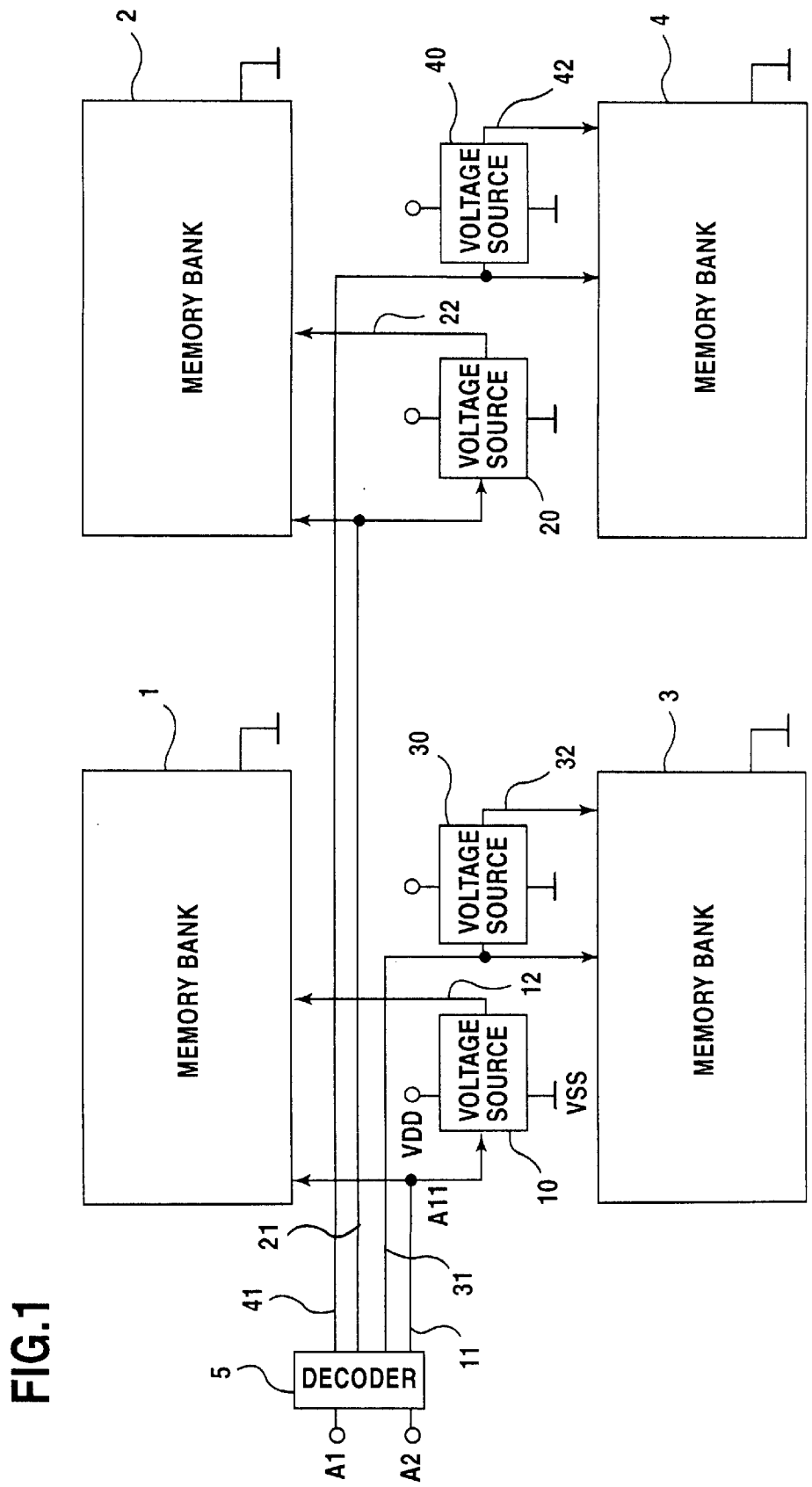
FIG. 1 is a diagrammatic, block circuit diagram illustrating the principle of an integrated semiconductor memory according to the invention.

In all the figures of the drawing, sub-features and integral parts that correspond to one another bear the same reference symbol in each case. Referring now to the figures of the drawing in detail and first, particularly, to FIG. 1 thereof, there is shown a semiconductor memory including four memory banks 1, 2, 3, 4. Each memory bank 1–4 contains a plurality of memory cells and the corresponding functional units for reading and writing the memory cells in the bank of memory cells. For a 1 Gbit memory each of the memory banks 1–4 has a storage capacity of 256 Mbit. A memory bank 1–4 can be selected through a respective address. For example the two highest bits A1, A2 of an address of a relevant memory cell can serve for the selection. These bits, which if necessary are not received until after an upstream decoding procedure, are led to a decoder 5. On an output side, the decoder 5 has one line 11, 21, 31, 41 for each of the memory banks 1, 2, 3, 4 respectively. If one of the lines 11, 21, 31, 41 is activated this results in that a memory access is taking place at one of the memory cells in the memory bank 1–4 assigned to the respective line. The memory bank 1–4 is then switched to an active state, i.e. all supply voltages and any other functional units in the respective memory bank 1–4 necessary for memory access are set in a state such that it is possible to read or write a memory cell in the memory bank 1–4.

Each of the memory banks 1, 2, 3, 4 is assigned a separate supply voltage source 10, 20, 30 and 40 respectively. At an output line 12, the supply voltage source 10 generates a word line voltage, a bit line voltage or a substrate bias—or an appropriate potential relative to ground VSS—which is applied to the memory bank 1. The supply voltage source 10 can also provide one or several of these supply voltages in parallel. The source 10 is controlled in such a way that it delivers a potential with a higher drive capability if the memory bank 1 is activated, i.e. one of the memory cells disposed in it is being accessed. If the memory bank 1 is deactivated, i.e. if one of the other memory banks 2, 3, 4 is being accessed, the respective supply voltage or potential at the output 12 of the of supply voltage source 10 is provided with a low drive capability. This also includes the possibility that the supply voltage source 10 is disconnected completely.

At a low drive power or if the supply voltage source 10 is disconnected it has hardly any or no power loss. If a memory access occurs at only a single memory cell and only the relevant memory bank is activated while the other memory banks are deactivated the power loss of the voltage generators in the most favorable case is only one quarter of that for the supply voltage source according to the concept of the prior art in which all of the memory areas are equally supplied.

It is useful if the changeover between the high and low drive power of the supply voltage source 10 is effected through the signal at the decoder output line 11. For this purpose the line 11 is connected both with the memory bank 1 and with the respective control input for controlling the drive power of the supply voltage source 10. The other supply voltage sources 20, 30, 40 have a function corresponding to the above description and a corresponding structure.

In FIG. 1 each of the memory banks 1–4 is assigned a separate supply voltage source 10, 20, 30, 40. In the practical realization, however, this includes the possibility that parts of these supply voltage sources 10, 20, 30, 40 are used jointly by different memory banks 1–4. It is useful that parts of the supply voltage sources 10, 30 are combined and for example only the respective outputs 12, 32 are connected and disconnected. The same applies correspondingly for the sources 20, 40.

Figure 2:
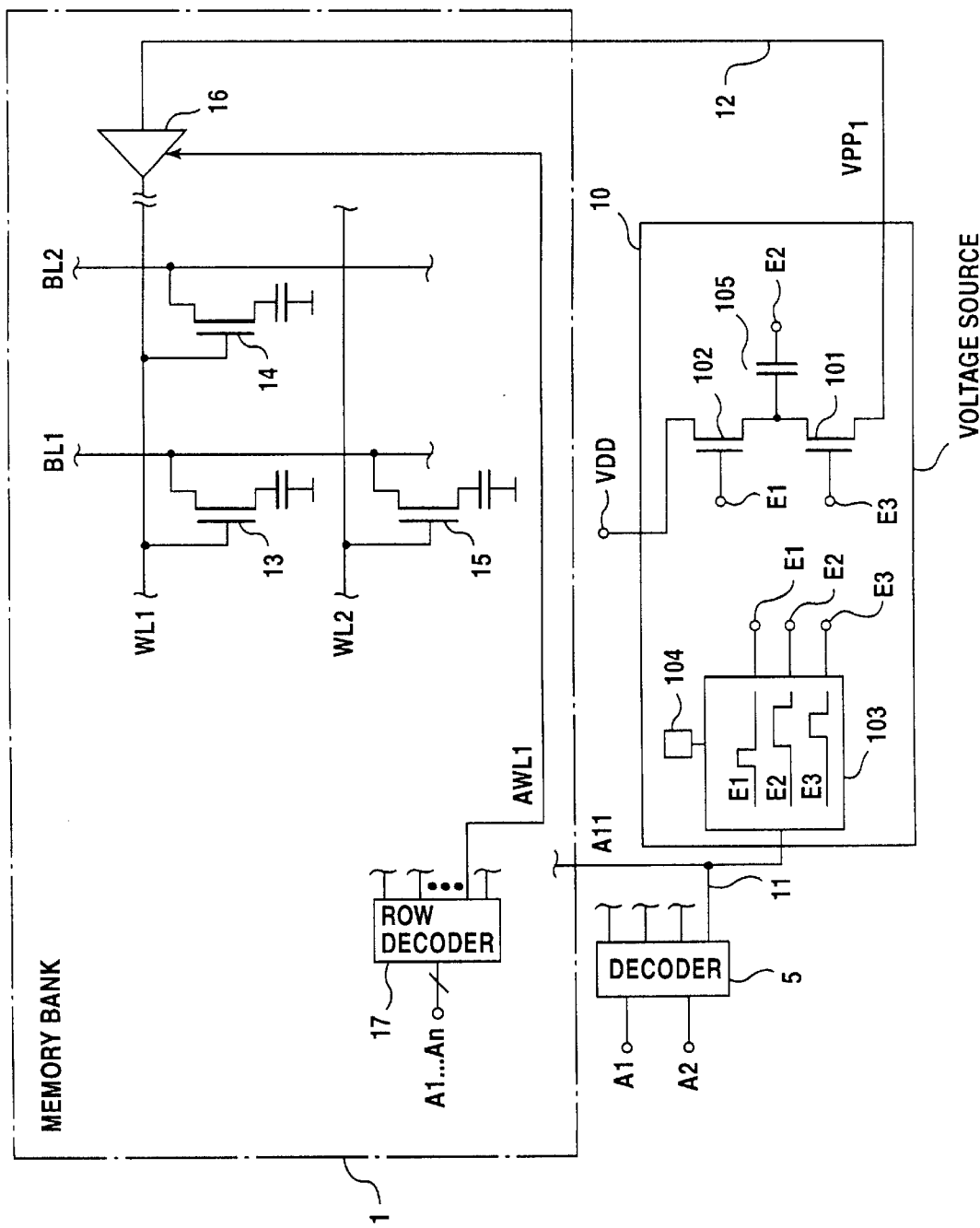
FIG. 2 is a circuit diagram of a detail part of an embodiment for generation of a word line voltage.

FIG. 2 shows in detail a part of the integrated semiconductor memory in which the supply voltage source 10 provides at the line 12 a supply potential VPP1 for a word line of the memory bank 1. The memory bank 1 contains an array of memory cells of which the memory cells 13, 14, 15 are illustrated. Word lines WL1, WL2 and bit lines BL1, BL2 serve for selecting one of the memory cells. The memory cells 13, 14 are addressed by a positive potential at the word line WL1. The respective access transistor of the memory cells 13, 14 is then switched to a conducting state. Through selecting a bit line, e.g. BL1, the data information is read out from the memory cell 13 disposed at the intersection of the word line WL1 and the bit line BL1. The potential VPP1 of the word line WL1, in an activated state, is higher than the supply potential VDD applied externally to the semiconductor chip. This has the effect that the access transistors of the memory cells 13, 14, which are constructed as n-channel MOS transistors, are controlled to be completely conducting and the information stored in the memory cells 13, 14 can be read out without losses and read in without losses. Thus the voltage applied over the line 12 is also greater than the externally applied supply voltage VDD, VSS. The supply potential VPP1 of the line 12 is applied to the word lines over a switchable amplifier 16. The amplifier 16 is activated so that the potential VPP1 of the line 12 is connected through to the word line WL1 if the word line WL1 is activated for an access to the memory cell 13. For this purpose a row decoder 17 receives the address A1, . . . , An of the memory cell 13 or a previously decoded address from it, and a control signal AWL1 generated by the row decoder 17 is applied to the amplifier 16.

In order to generate the increased supply potential VPP1 at the line 12 the supply voltage source 10 is constructed as a charge pump 10 or a booster circuit 10. It contains two n-channel MOS transistors 101, 102 with their drain-source sections connected in series, which transistors 101, 102 are connected between the supply potential connection VDD of the semiconductor chip and the output connection 12. A capacitor 105 is connected to a coupling node of the transistors 101, 102. Gate connections of the transistors 101, 102 and the other connection of the capacitor 105 are each controlled by a control signal E1, E3 or E2 respectively. The control signals E1, E2 and E3 are generated in a logic device 103 that is driven by an oscillator 104. For generation of the raised output voltage during a memory access the charge pump 10 is operated at full load, i.e. the drive capability is high in reference to the output potential VPP1 at the connection 12. For this purpose the periodic control signals E1, E2, E3 are generated with higher frequency. If no memory access of the memory bank 1 takes place and therefore the memory bank 1 is disconnected through the signal A11 at the connection 11 of the decoder 5, the potential VPP1 at the output connection 12 of the supply voltage source 10 has a lower drive capability. Therefore, either the supply voltage source 10 is completely disconnected or that it supplies an output potential that is still at a level of the word line voltage in the active state but has lower drive capability. Ideally the drive capability is just high enough to compensate for losses from leakage currents. For switching over between these operating states of the supply voltage source 10 the signal A11 applied to the line 11 is applied to an input side of the supply voltage source 10, which signal A11 also activates the memory bank 1. It is useful if this controls the logic device 103 for generating the control signals E1, E2, E3. Alternatively the frequency of the oscillator 104 can also be switched over from a high working frequency to a low frequency.

For the non-illustrated embodiment in which the supply voltage source 10 generates a substrate bias, the output 12 carries the substrate potential VBB. Instead of the connection shown in FIG. 2 the output 12 is connected with a substrate connection which provides the substrate potential for the memory bank 1. The substrate potential is the lowest of all the potentials arising in the semiconductor chip. It has the effect of compensating for a potential increase of the substrate due to the switching processes, in that charge carriers arising in the substrate are absorbed. This has the effect that leakage currents are reduced, depletion layer capacities are increased and the danger of latch-up is reduced. The substrate potential is lower than the externally applied ground potential VSS, i.e. the substrate bias is lower than the externally applied supply voltage VDD, VSS of the semiconductor chip. For this purpose, the transistor 102 is constructed as a p-channel MOS transistor, deviating from what is shown in FIG. 2, and is connected with a negative pole VSS of the supply voltage. The control signals E1, E2 and E3 are adapted accordingly.

The remaining supply voltage sources 20, 30, 40 are constructed correspondingly to the supply voltage source 10; the same applies for the memory banks 2, 3, 4 in respect of the memory bank 1.

FIG. 3 shows in detail a part of the integrated semiconductor memory in which the supply voltage source 10 provides at the line 12 a supply potential VBLH12 for the bit lines of the memory bank 1. Two bit lines BL1, BL2 are jointly connected at opposite phase inputs of a read amplifier 130. Before a read process the bit lines BL1, BL2 are precharged to the supply potential VBLH12. The read process then begins in that the potentials of the bit lines BL1, BL2 are shorted and therewith compensated. This is performed through a transistor 134 which is switched to a conducting state by an appropriate control signal VEQ. The precharge potential VBLH12 lies within the externally applied supply voltage of the semiconductor chip VDD, VSS. The precharge potential VBLH12 is approximately 30% lower than the positive supply potential VDD. The control signal A11 leads to activation of both the memory bank 1 and the supply voltage source 10 so that the bit line precharge voltage VBLH12 is built up at its output connection 12. The bit lines BL1, BL2 are activated according to a column decoding procedure. For this purpose a column decoder 133 is provided which activates a decoded control signal ABL12 from the applied addresses A1, . . . , An. The control signal ABL12 connects amplifiers 131, 132 respectively over which the bit line precharge voltage VBLH12 is applied to the bit lines BL1, BL2.

In this case the supply voltage source 10 is a controlled supply voltage source 10. It contains an operational amplifier 110. On an output side, it has a current path which contains a p-channel MOS transistor 112 on a side of the positive supply potential VDD. A gate connection of the transistor 112 is connected over a further p-channel MOS transistor 111 with a connection for the potential VDD. A gate connection of the transistor 111 is controlled by the signal A11. Through this the generator is connected and disconnected.

As illustrated in FIGS. 2 and 3 the memory banks 1–4 operate independently from each other in respect of memory accesses. In other words if one of the memory banks 1–4 is accessed the other memory banks 1–4 are not affected. The other memory banks 1–4 can also be subjected to a simultaneous memory access, or not. Each of the memory banks 1–4 has a separate address decoder assigned to it alone, which is divided into a row decoder and a column decoder, e.g. 17 and 133 respectively. Only the memory cells disposed in the memory bank can be addressed over the address decoder for this memory bank. It is not possible to address memory cells of different memory banks 1–4 over the same address decoder. The word lines addressable by the line address decoder and the bit lines addressable by the column address decoder run exclusively within one memory band and do not lead into a different memory bank. Write/read amplifiers (sense amplifier) serve solely for amplifying data signals that are stored by or read out from memory cells within the memory bank.

We claim:

1. An integrated semiconductor memory, comprising:

a plurality of memory banks including a first memory bank and a second memory bank each having memory cells and an address decoder for addressing said memory cells, through said address decoder only said memory cells of a respective memory bank of said plurality of memory banks being addressable;

controllable supply voltage sources, each of said controllable supply voltage sources associated with and supplying one of said plurality of memory banks with a respective supply potential; and a decoder generating output signals, a respective output signal of said output signals received by each of said plurality of memory banks, said respective output signal from said decoder activating and deactivating a memory access to said respective memory bank by controlling said respective supply potential provided by an associated one of said controllable supply voltage sources, said respective memory bank being provided with a higher drive capability if said respective memory bank being activated through said respective output signal and provided with a lower drive capability if said respective memory bank being deactivated through said respective output signal.

2. The integrated semiconductor memory according to claim 1, wherein each of said controllable supply voltage sources receives a main supply voltage and have an output outputting said respective supply potential that can lie outside the main supply voltage received.

3. The integrated semiconductor memory according to claim 1, wherein each of said controllable supply voltage sources is driven in a clocked manner and has a clock frequency that can be switched between a first frequency and a second frequency in dependence on said respective output signal of said decoder through which said respective memory bank can be activated and deactivated.

4. The integrated semiconductor memory according to claim 1, wherein each of said controllable supply voltage sources can be connected and disconnected by said output signals of said decoder through which said plurality of memory banks can be activated and deactivated.

5. The integrated semiconductor memory according to claim 1, wherein said decoder has an input for receiving an address signal for selecting one of said plurality of memory banks, said decoder has a plurality of outputs and each of said plurality of outputs connected with one of said plurality of memory banks and with said associated one of said controllable supply voltage sources.

6. The integrated semiconductor memory according to claim 1, including:

word lines connected to said memory cells of each of said plurality of memory banks through which at least one of said memory cells disposed in said plurality of memory banks can be selected by a control signal for reading and writing a data value; and switches, a respective one of said switches connected to each of said word lines, said controllable supply voltage sources generating word line supply voltages received by said switches and applied to said word lines, said switches receiving said control signal for controlling a conducting state of said switches.

7. The integrated semiconductor memory according to claim 1, including a semiconductor substrate in which said plurality of memory banks are disposed, said controllable supply voltage sources each generating a substrate potential to be applied to a fraction of said semiconductor substrate containing an associated memory bank to which said controllable supply voltage sources are associated with.

8. The integrated semiconductor memory according to claim 1, including:
   bit lines connected to said memory cells of said plurality of memory banks through which data values of at least one of said memory cells disposed in said plurality of memory banks can be accessed for reading and applied for writing; and
   switches, a respective one of said switches connected to each of said bit lines, said controllable supply voltage sources generating bit line supply voltages received by said switches and applied to said bit lines.

9. The integrated semiconductor memory according to claim 1, wherein each of said plurality of memory banks have said address decoder for selecting said memory cells through which only said memory cells of said respective memory bank can be selected.

* * * * *